(12) United States Patent
Gaietto et al.

(10) Patent No.: US 11,096,296 B2
(45) Date of Patent: *Aug. 17, 2021

(54) INFORMATION DISPLAY PRODUCT

(71) Applicant: Jordan Michael Dwight Gaietto, Mariemont, OH (US)

(72) Inventors: Jordan Michael Dwight Gaietto, Mariemont, OH (US); Scott Allen Custer, Monroe, OH (US)

(73) Assignee: Jordan Michael Dwight Gaietto, Mariemont, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/273,869

(22) Filed: Feb. 12, 2019

(65) Prior Publication Data

US 2019/0373748 A1 Dec. 5, 2019

Related U.S. Application Data

(63) Continuation of application No. 15/991,639, filed on May 29, 2018, now Pat. No. 10,237,993.

(51) Int. Cl.

| H05K 5/02 | (2006.01) |
| H05K 5/00 | (2006.01) |
| H05K 7/18 | (2006.01) |
| G09F 7/18 | (2006.01) |
| H05K 7/08 | (2006.01) |
| G09F 9/30 | (2006.01) |
| G09F 15/00 | (2006.01) |

(52) U.S. Cl.
CPC ............ *H05K 5/0204* (2013.01); *G09F 7/18* (2013.01); *H05K 5/0017* (2013.01); *H05K 5/0247* (2013.01); *H05K 7/08* (2013.01); *H05K 7/18* (2013.01); *G09F 9/30* (2013.01); *G09F 15/0056* (2013.01); *G09F 2007/1843* (2013.01); *G09F 2007/1852* (2013.01)

(58) Field of Classification Search
CPC . G09F 9/3026; G09F 7/18; G09F 9/30; G09F 2007/1852; H05K 1/181; H05K 7/14; H05K 7/18; H05K 5/0204; H05K 5/0017; H05K 5/0247; H05K 7/08; G06F 3/1446; G06F 3/147
See application file for complete search history.

(56) References Cited

U.S. PATENT DOCUMENTS

| 5,065,290 A | 11/1991 | Makar et al. |
| 5,736,967 A | 4/1998 | Kayser et al. |
| 5,816,696 A | 10/1998 | Beisler |
| 6,209,831 B1 | 4/2001 | Kiplinger et al. |
| 7,597,448 B1 | 10/2009 | Zarian |

(Continued)

*Primary Examiner* — James Wu
(74) *Attorney, Agent, or Firm* — Frost Brown Todd LLC

(57) ABSTRACT

An information display system includes an information display base and an information display carrier. The information display base includes a mounting panel which includes a first electrical conductor, and a second electrical conductor spaced from the mounting panel. The information display carrier includes a mount, a first electrical terminal that, when mounted to the mounting panel, contacts the first electrical conductor of the mounting panel, and a second electrical terminal that extends through an opening in the mounting panel and contacts the second electrical conductor of the mounting panel.

17 Claims, 15 Drawing Sheets

(56) References Cited

U.S. PATENT DOCUMENTS

| | | |
|---|---|---|
| 7,605,772 B2 | 10/2009 | Syrstad |
| 8,879,224 B2 | 11/2014 | Moore |
| 9,326,620 B1 | 5/2016 | Cross et al. |
| 9,774,134 B2 | 9/2017 | Bonner et al. |
| 10,237,993 B1* | 3/2019 | Gaietto ............... H05K 5/0204 |
| 2010/0175919 A1* | 7/2010 | Ellis ..................... H01R 25/16 |
| | | 174/481 |
| 2012/0228240 A1 | 9/2012 | Gentile et al. |
| 2014/0003050 A1* | 1/2014 | Hemiller ............... F21V 21/34 |
| | | 362/249.01 |
| 2015/0083744 A1 | 3/2015 | Vogler et al. |

* cited by examiner

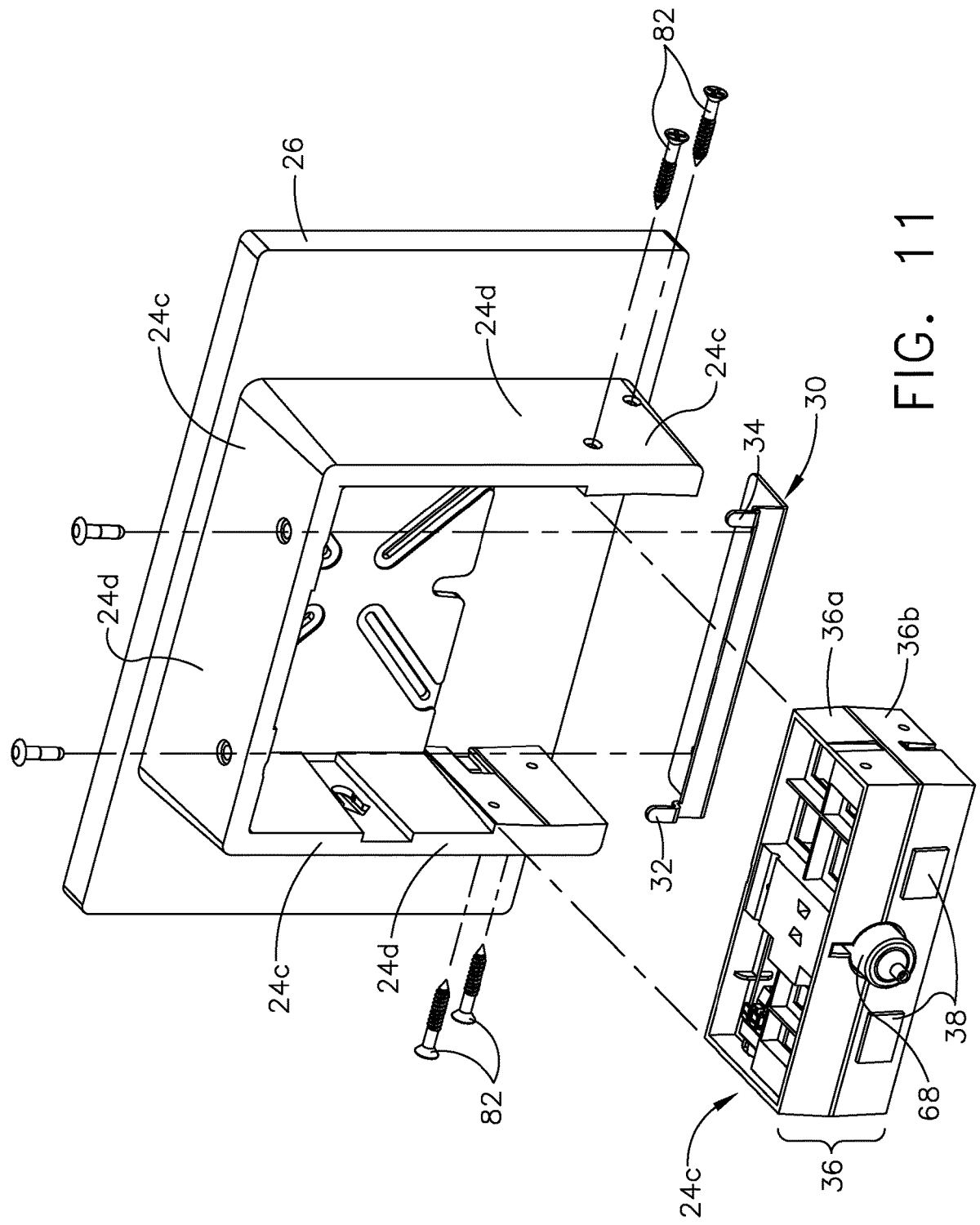

INFORMATION DISPLAY PRODUCT

BACKGROUND

The present disclosure relates generally to information display systems, and is more particularly directed to such systems which requires connection to an external electrical energy source and its individual components. The innovation will be disclosed in conjunction with a display base to which an information display device, having two electric terminals, may be selectively mounted thereby placing the two electrical terminals in electrical contact an external electrical energy source through the display base.

Displays are typically configured to provide information. A non-limiting example of displays are retail displays, which are configured to draw consumers' attention to the information displayed. Displays may include display devices mounted thereto or carried thereby that require electrical energy. Sometimes the electrical energy comes from sources carried by the display devices, such as batteries. Often the electrical energy is external to the display, such as coming from an external electrical energy source such as the electrical power grid. Delivering such external energy to display devices can be difficult, especially when it is desired to maintain the flexibility of locating and relocating such display devices to different spots on the retail display. External electrical cords are cumbersome and unsightly. Specialized labor, such as electricians, may be required to relocate and rewire display devices, adding to the cost of changing the display.

The present innovation provides a safe and flexible display system that allows information display devices to be easily and quickly located or relocated within the information display system without rewiring or specialized labor or knowledge.

BRIEF DESCRIPTION OF THE FIGURES

The accompanying drawings together with specification, including the detailed description which follows, serve to explain the principles of the present innovation.

FIG. 11 is a perspective view of the information display device illustrating the body of the information display partially exploded.

DETAILED DESCRIPTION

Figure 1:
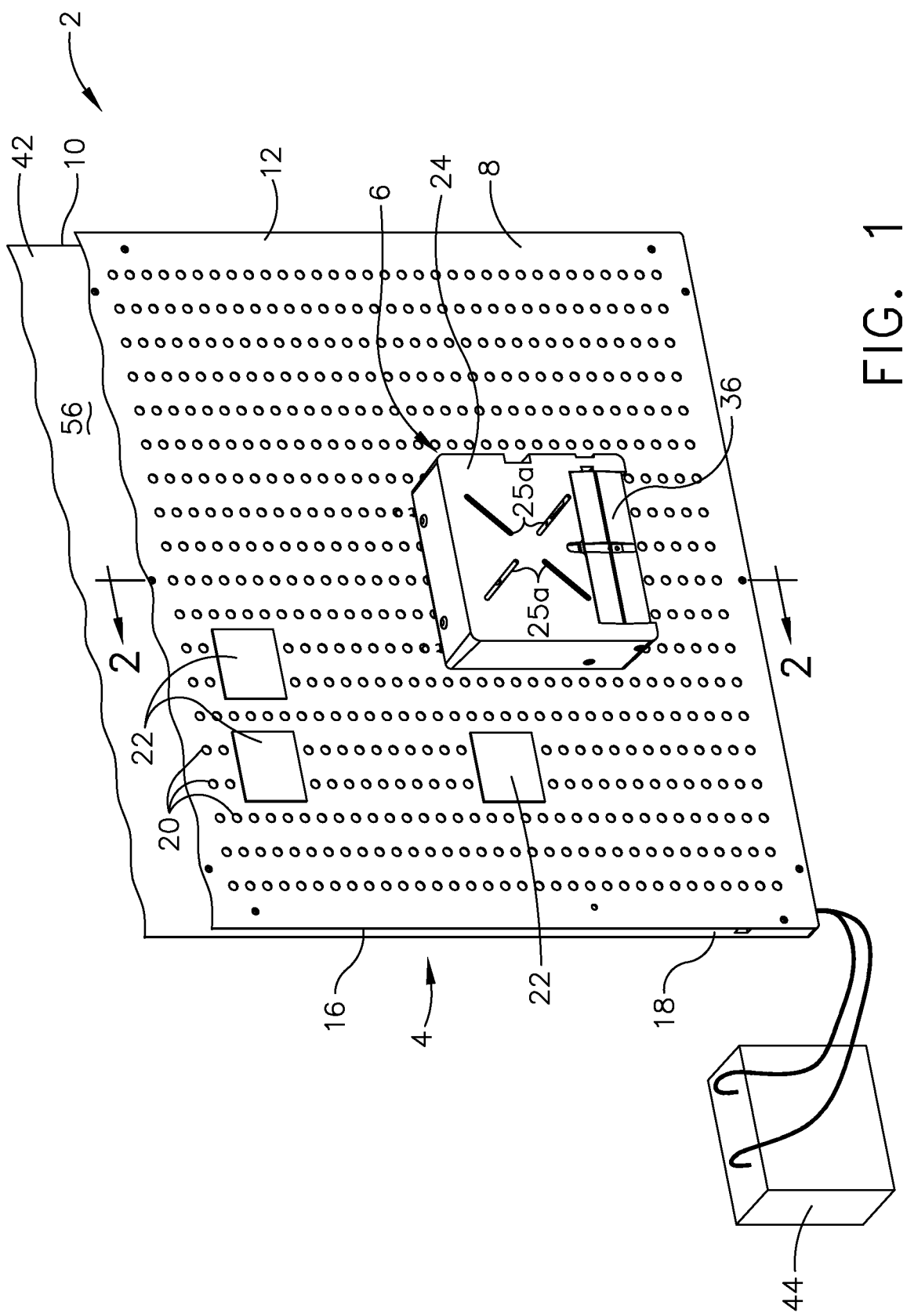
FIG. 1 is a front isometric view of an information display system constructed in accordance with the teachings of the present innovation.

In the following description, like reference characters designate like or corresponding parts throughout the several views. Also, in the following description, it is to be understood that terms such as front, back, inside, outside, and the like are words of convenience and are not to be construed as limiting terms. Terminology used in this patent is not meant to be limiting insofar as devices described herein, or portions thereof, may be attached or utilized in other orientations.

Any disclosure or portion thereof of any patent, publication or other disclosure material that is incorporated by reference herein which conflicts with definitions, statements or other disclosure material set forth herein will only be incorporated to the extent that no conflict arises between that incorporated material and the existing disclosure material.

The word "exemplary" is used herein to mean "serving as an example, instance, or illustration." Any implementation described herein as "exemplary" is not necessarily to be construed as preferred or advantageous over other implementations.

Figure 2:
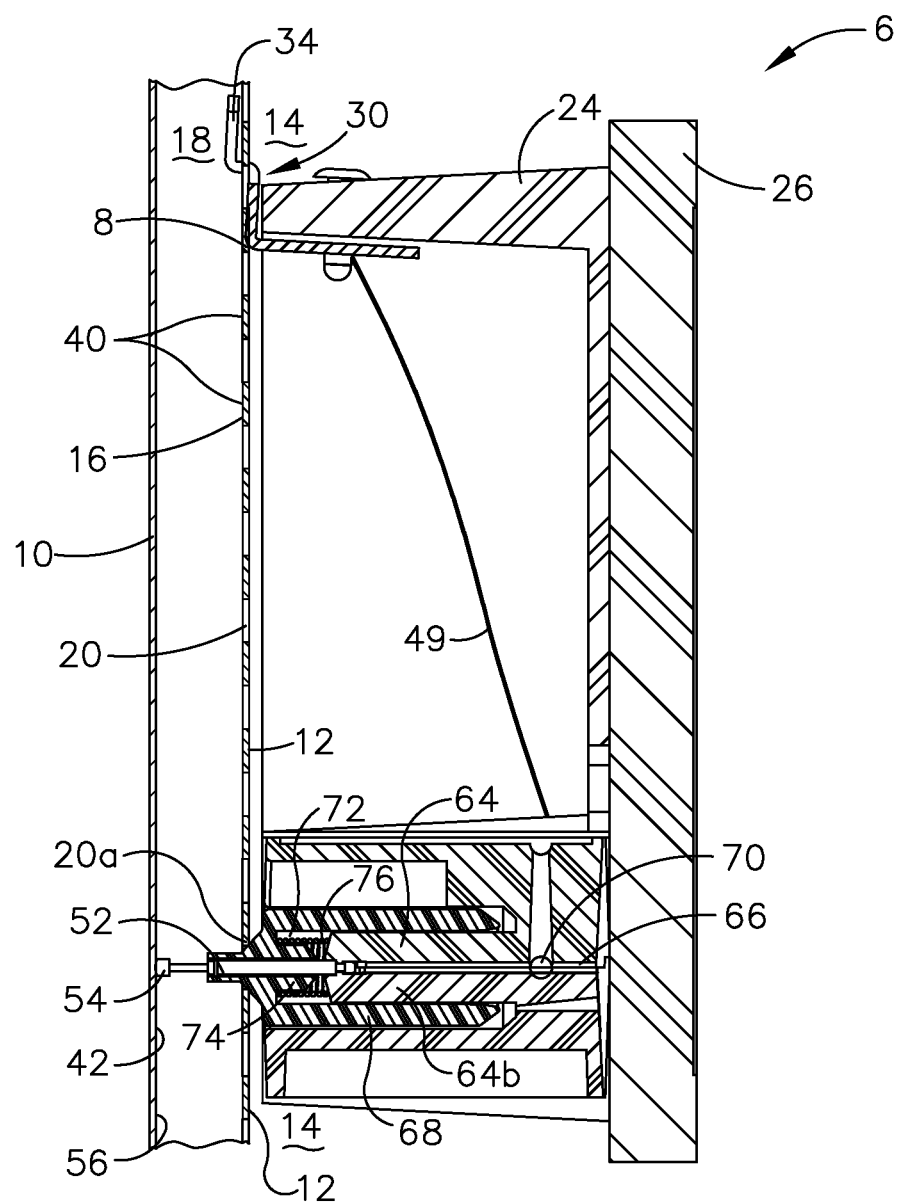
FIG. 2 is a fragmentary cross-sectional side view of the information display device, mounting panel and electrical conductor of the information display system of FIG. 1 taken along line 2-2.

Referring to the drawings, FIG. 1 depicts information display system 2 comprising information display base 4 and information display carrier 24 of information display device 6. Information display base 4 includes mounting panel 8 and second panel 10. Referring also to FIG. 2, mounting panel 8 includes first surface 12 which defines first side 14 and second surface 16 which defines second side 18. Second panel 10 is disposed on second side 18 spaced apart from second surface 16. Mounting panel 8 may be of any suitable size and shape. Second panel 10 may be of any suitable size and shape. Second panel 10 may be coextensive with mounting panel 8 as shown in the embodiment depicted, or may have a different than mounting panel 8. Second panel 10 may comprise a plurality of discrete panels.

Mounting panel 8 is illustrated as having a plurality of spaced apart openings 20 which extend through mounting panel 8 from first surface 12 to second surface 16. The plurality of spaced apart openings 20 may be arranged in any suitable manner for cooperating with information display device 6 to permit information display device 6 to be supported by mounting panel 4 in one or more desired locations. Openings 20 may be disposed in a pattern, and such pattern may be uniform across most or all of mounting panel 8, or the pattern may be uniform within one or more regions of mounting panel 8. One such pattern comprises vertical columns and horizontal rows, as illustrated in FIG. 1. In one configuration, mounting panel 8 may be a peg board.

The plurality of spaced apart openings 20 may also be disposed to support and locate other items 22 of any nature, for example products, articles, informational cards, etc., whether or not such items are offered for sale. Depending on the configuration of the mount (one embodiment of which is described below) of information display device 6, openings 20 may not be required for mounting and locating information display device 6 in one or more desired locations: Openings 22 may only be necessary to provide access to second panel 10 for a distal end of one of the electrical terminals of the information display device 6 as described below.

Figure 3:
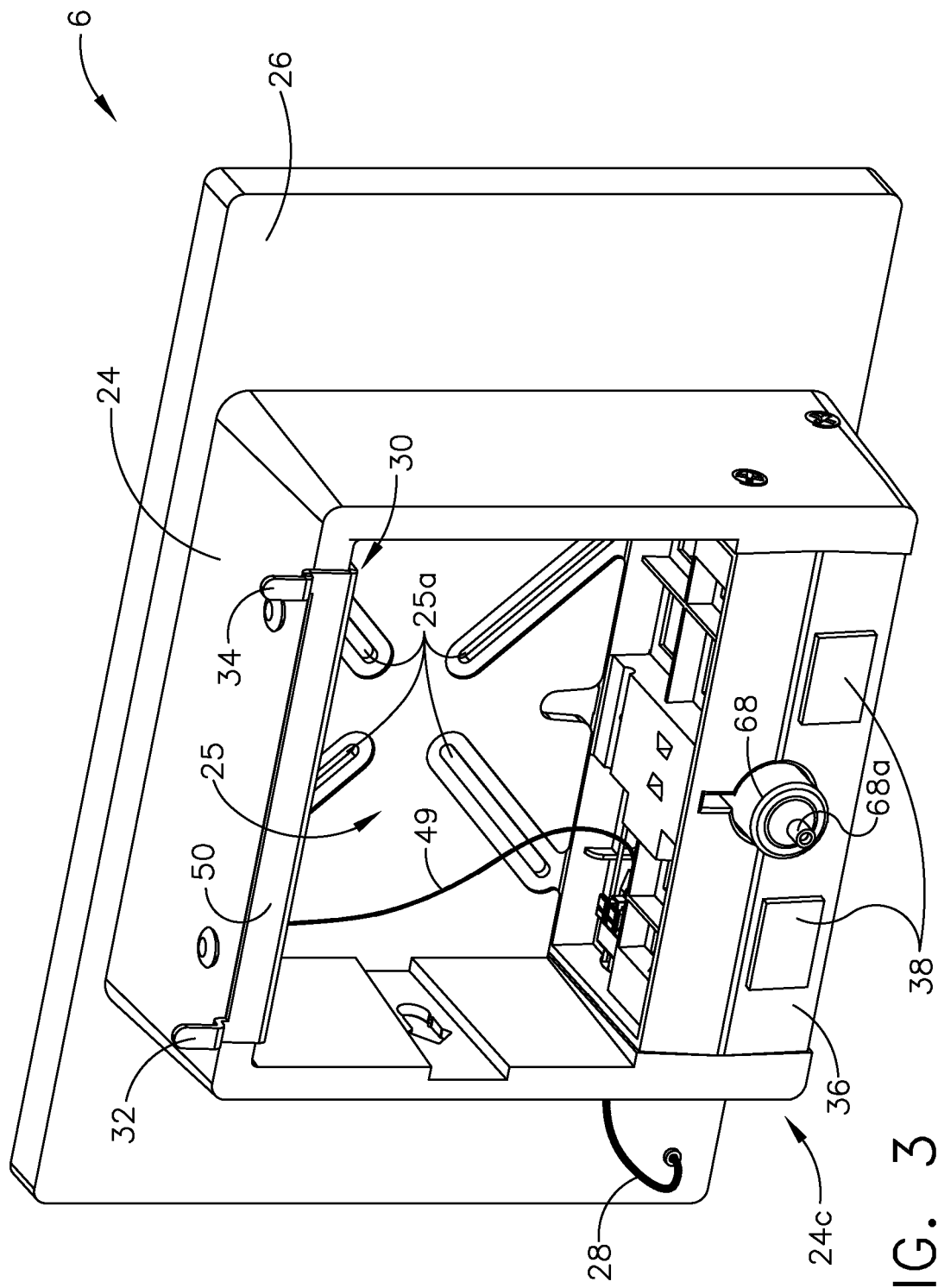
FIG. 3 is rear perspective view of the information display device of FIG. 1.
Figure 4:
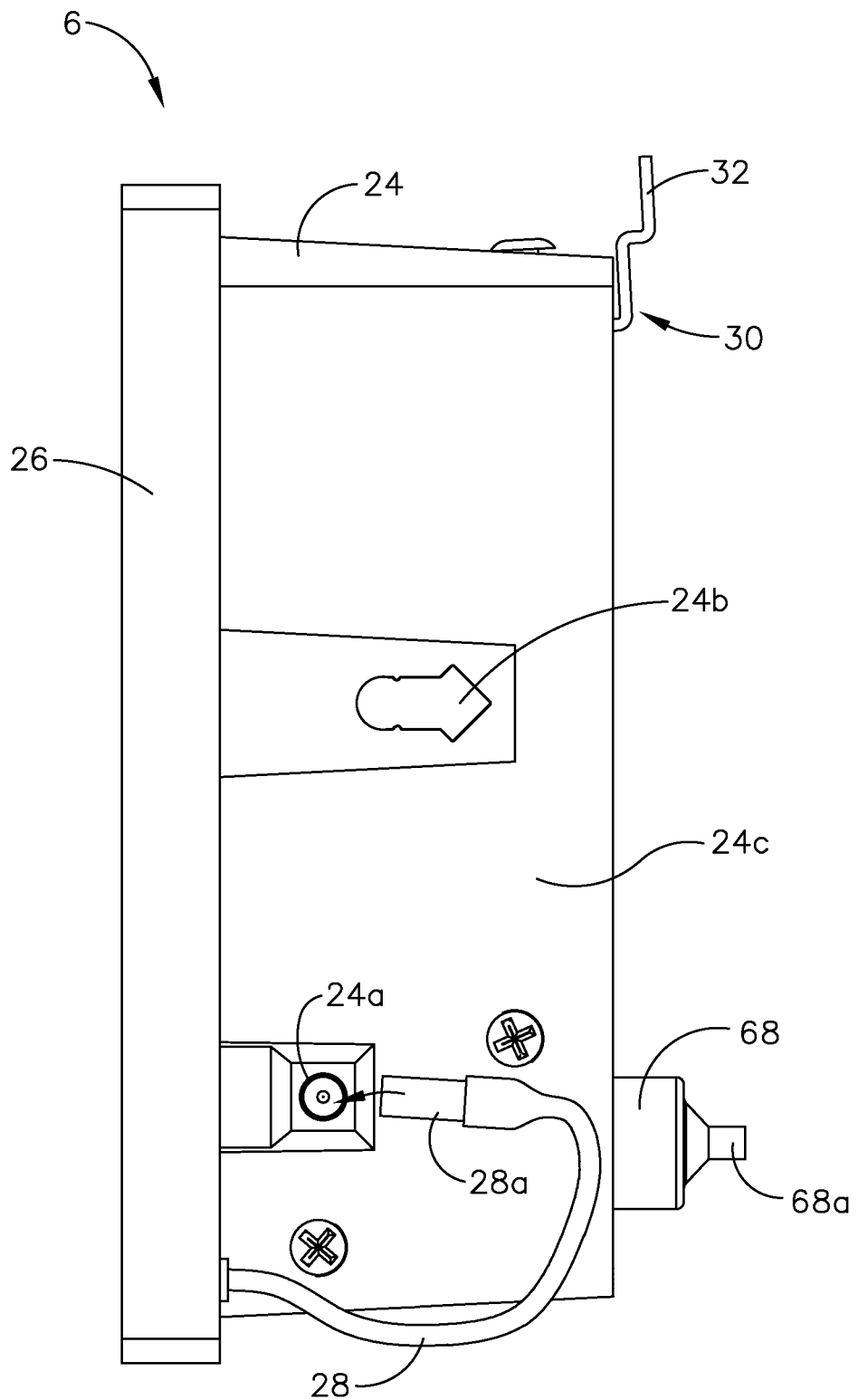
FIG. 4 is a side view of the information display device of FIG. 1.

Referring also to FIGS. 3 and 4, information display device 6 comprises information display carrier 24 and information display 26. As used herein, an information display device is a device which is configured to display information in any form perceivable by any of the human senses, such as including without limitation, a visual display, an audible display, a scent enabled display, a tactile display or a display with physical motion. Information display device 6 may be interactive, and may be remotely controllable or programmable, such as by wired or wireless signals. Information display system may display products for sale. In the embodiment depicted, information display 26 is carried by information display carrier 24, and may be fastened thereto in any suitable manner, including but not limited, by fasteners including but not limited to threaded fasteners, hook and loop fasteners, adhesive, magnets, or any other suitable configuration. Information display carrier 24 may include a mounting pattern 25 which may be a standard mounting pattern for displays, such as VESA flat display mounting interface standards. In the embodiment depicted, mounting pattern 25 comprises a plurality of slots 25a sized and oriented complementarily to information display 26.

Information display 26 may be a unitary construction containing all electrical components for the display, such as a tablet or iPad® computer or the like. Information display 26 may have an electrical power input interface, such as a jack, terminals or conductor 28 extending from information display 26. Conductor 28 may include terminus 28a, which may be of any suitable configuration, such as the standard interface which is schematically depicted in FIG. 4. Information display carrier 24 may include jack 24a configured to connect with terminus 28a. Any suitable structure and configuration may be used to provide electrical connection between information display carrier 24 and information display 26. For example, information display 26 may have a USB port. A cable, with the appropriate complementary end connectors, may be plugged in to the USB port and to jack 24a. Yet another alternate is for information display 26 to be directly wired into information display carrier 26 without a plug or jack, in which case the electrical connection conductor 28 may be routed through opening 24b and directly connected to first and second electrical terminals 50, 52 which are described below.

Information display carrier 24 may also comprise mount 30 configured to selectively engage mounting panel 8 so as to locate body 24c and information display carrier 24 on first side 14, although it is to be understood that part of mount 30, although described herein as comprising part of information display carrier 24, may not be located on first side 14 when mount 30 is selectively engaging mounting panel so as to locate information display carrier on first side 14. In the embodiment depicted, mount 30 comprises first tab 32 and second tab 34 which are spaced apart from each other. Tabs 32 and 34 extend from information display device 6, and may be of any size and shape which is complementary to openings 20, allowing tabs 32, 34 to engage mounting panel 8. Tabs 32, 34 may be planar as illustrated, or may be any suitable shape such as curved. Mount 30 may comprise one or more mounts, such as with first tab 32 and second tab 34 not being integral.

Figure 5:
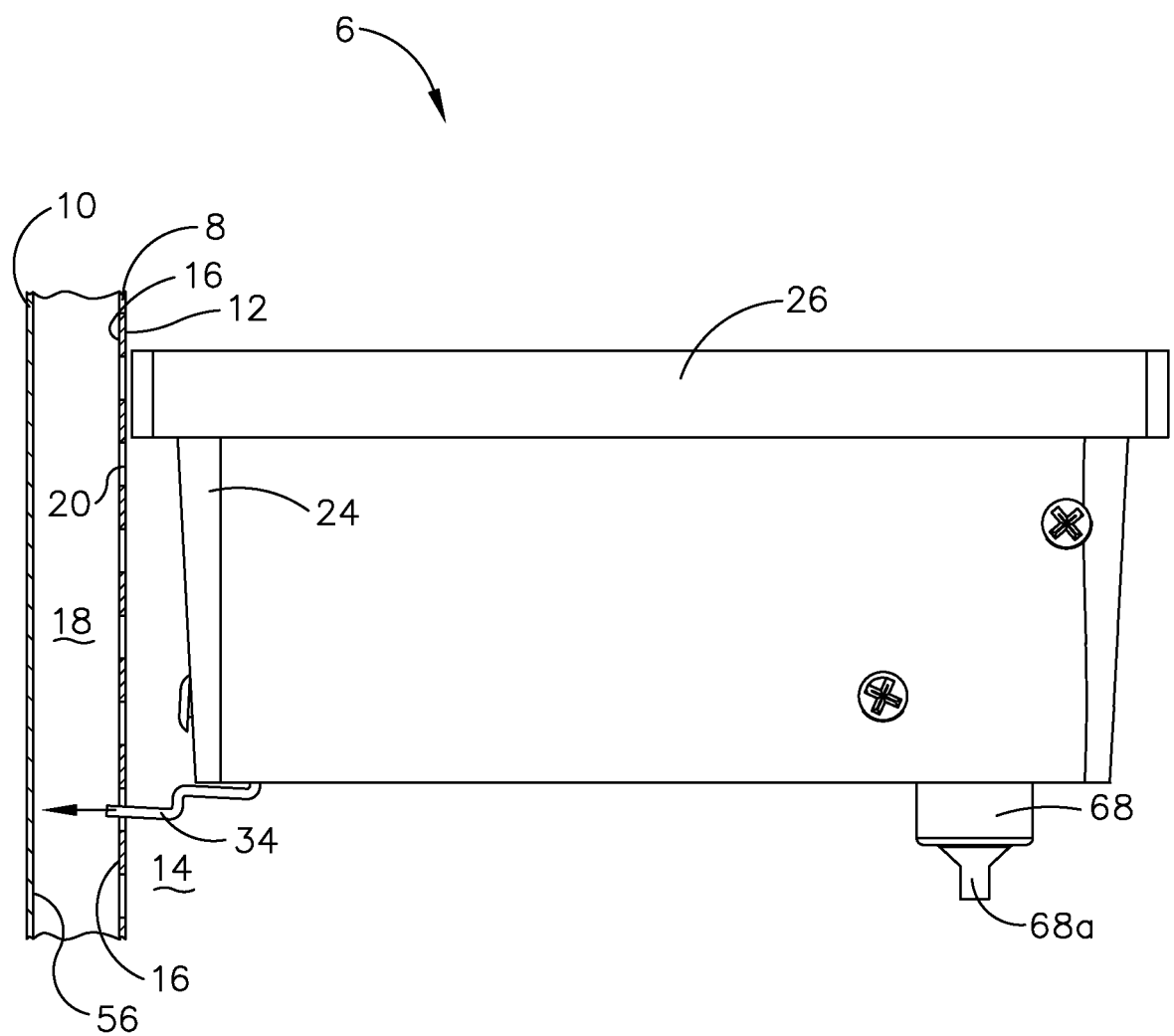
FIG. 5 is a side view of the information display device illustrating the information display device with the mount inserted into opening in the mounting panel but not yet locating or supporting the information display device.
Figure 6:
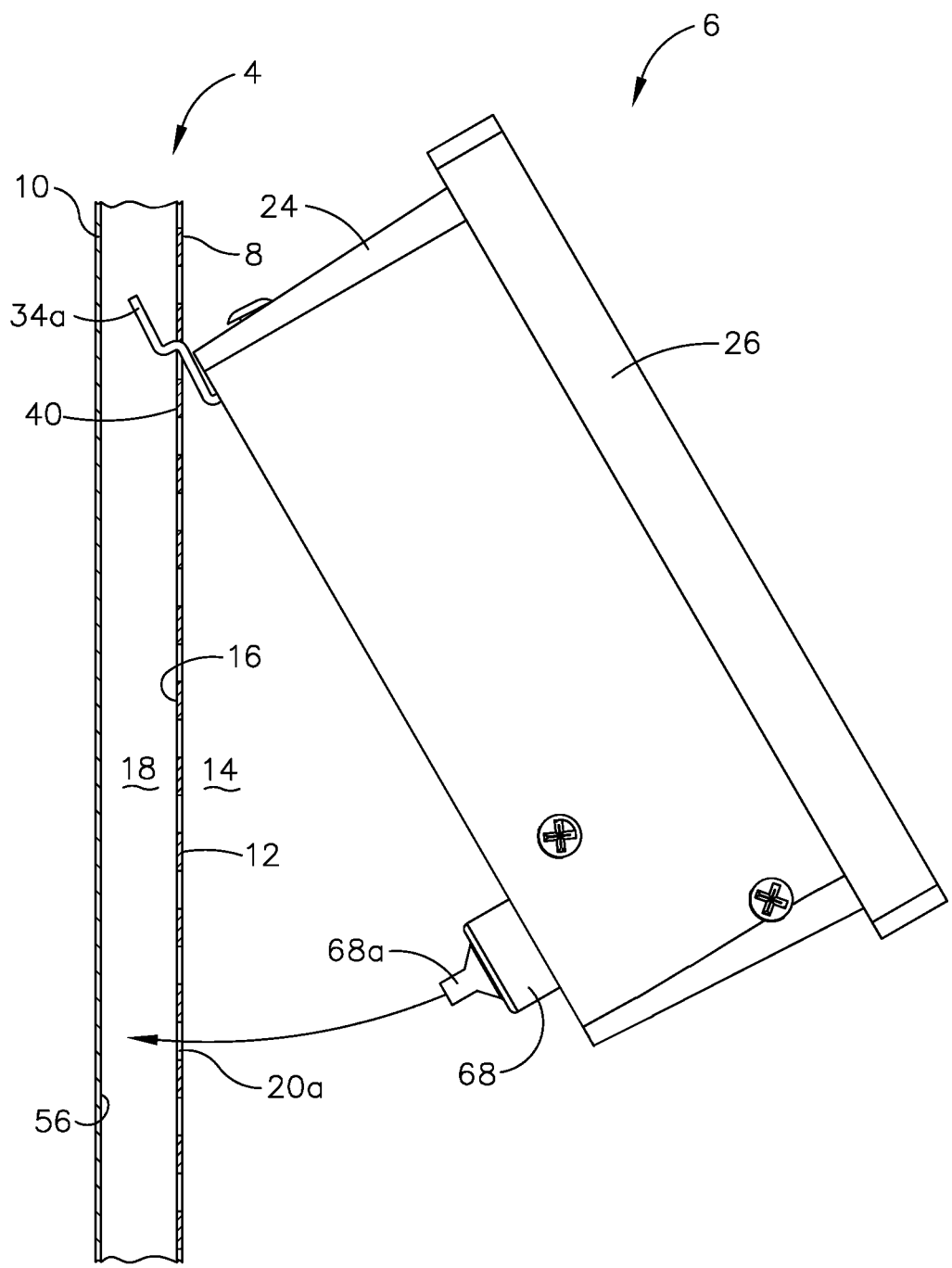
FIG. 6 is a side view similar to FIG. 5 illustrating the information display device rotated counter-clockwise relative to FIG. 5.
Figure 7:
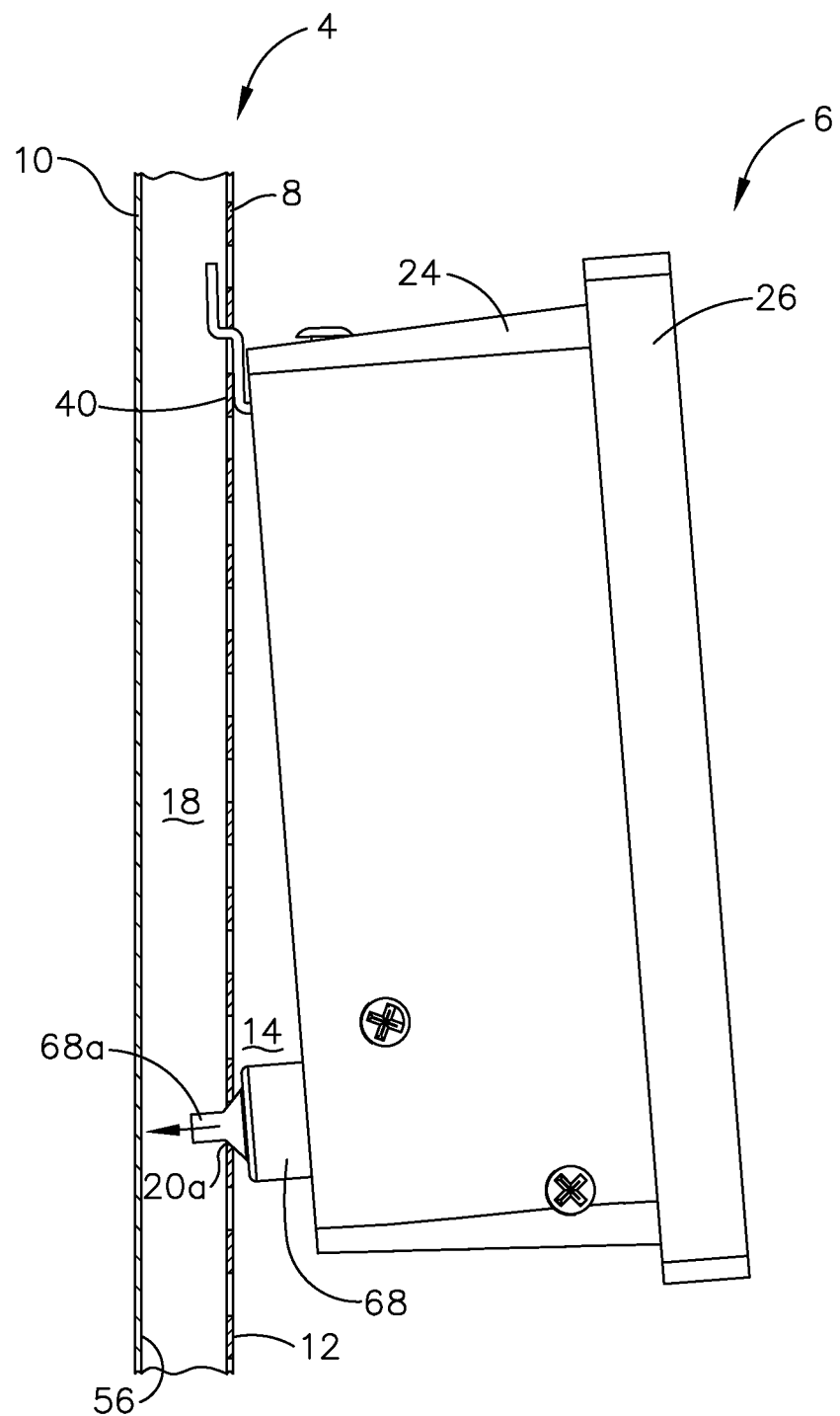
FIG. 7 is a cross-sectional side view similar to FIGS. 5 and 6 illustrating the information display device rotated more counter-clockwise than as shown in FIG. 6.

FIGS. 5, 6, 7 and 8 illustrate a way in which information display device 6 may be attached to mounting panel 6. FIG. 5 shows information display carrier 24 disposed on first side 14 at an orientation such that tabs 32, 34 can be inserted into respective openings 22. As seen in FIG. 6, information display carrier 24 is rotated counter-clockwise relative to FIG. 5 such that tip 34a extends through opening 22 beyond second surface 16. As described below, tip 68a of retractable shield 68 surrounds distal end 54 of second electrical terminal 52 (described below). Tip 68a is illustrated as arcuately aligned with opening 20a as information display device 6 pivots generally about mount 30 at mounting panel 8. FIG. 7 illustrates information display carrier 24 rotated further than shown in FIG. 6, with tip 68a of retractable shield 68, which is not retracted in FIG. 7, disposed within opening 20a.

Figure 8:
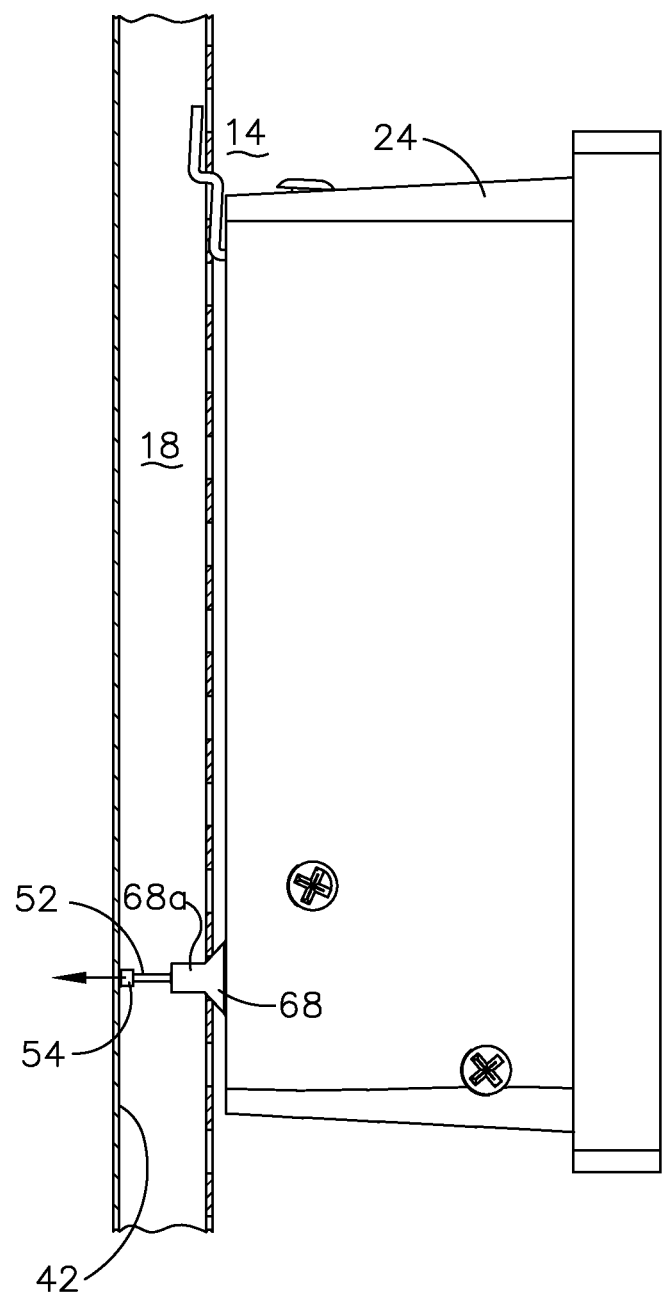
FIG. 8 is a cross-sectional side view similar to FIGS. 5, 6 and 7 illustrating the information display device fully rotated into display position.

FIG. 8 illustrates the full extent of counter-clockwise rotation of information display carrier 24, with retractable shield 68 retracted, exposing second electrical terminal 52. Further rotation of information display carrier 24 beyond that shown in FIG. 7 results in retractable shield 68 retracting with the advancement of information display carrier 24, and exposing second electrical terminal 52. Thus, distal end 54 of second electrical terminal 52 is surrounded by retractable shield 68 until tip 68a has extended through opening 20a. In this position, mount 30 is in engagement with panel 8 locating information display carrier 24 and information display 26 on first side 14. Mount 30 does not contact second panel 10 when inserted through openings 20.

Although mount 30 is illustrated as comprising one or more tabs 32, 34 which extend through openings 20 to locate body 24c and information display carrier 24 on first side 14, mount 30 may be of any suitable configuration. For example, mount 30 may be magnetic, such as a permanent magnet, disposed to be magnetically attracted to mounting panel 8. Information display carrier 24 may include one or more magnets 38 configured to magnetically attract information display carrier 24 toward mounting panel 8. If one or more magnets 38 is present, panel 8 should be configured to be magnetically attractable to magnet 38.

Information display carrier 24 is configured to be in electrical contact with an electrical energy source which is external to information display carrier 24. In the depicted embodiment, information display base 4 delivers external electrical energy to information display carrier 24. Information display base 4 may comprise locally stored electrical energy, such as a battery, or may be connectable to an electrical energy source which is external to information display base 4, such as the electrical power grid. In the embodiment depicted, mounting panel 8 comprises at least one first electrical conductor 40, and second panel 10 comprises at least one second electrical conductor 42, both of which are adapted to be in electrical contact with electrical energy source 44.

Figure 9:
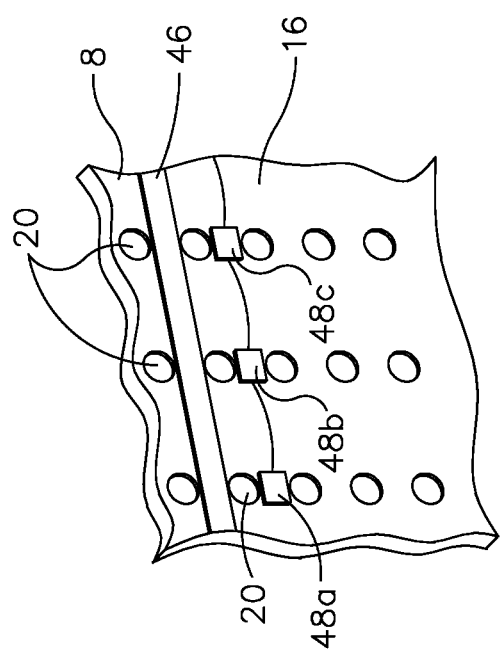
FIG. 9 is a fragmentary perspective view of an embodiment of the second surface of the mounting panel of the information display base.
Figure 12:
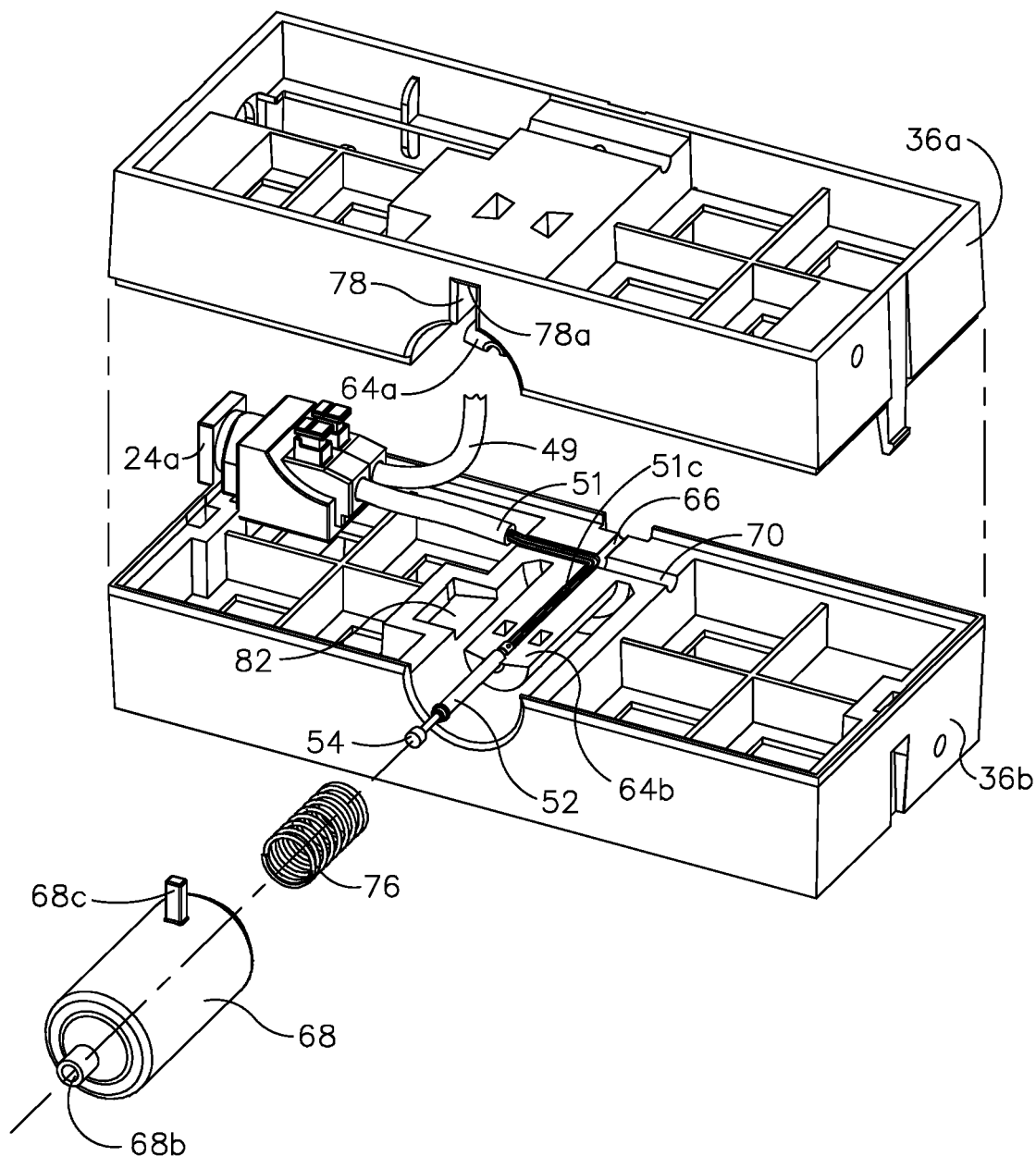
FIG. 12 is an exploded perspective view of the housing of the body of the information display carrier.

Mounting panel 8 may be made entirely of a conductive material, or may be made of a non-conductive material with one or more conductive elements disposed to be electrically contacted by first electrical terminal 50 (as described below). An entire surface of a side of mounting panel 8, such as second surface 16, may be conductive, such as by a conductive layer or coating applied to or integral with panel 8. Referring to FIG. 9, an embodiment of second surface 16 of mounting panel 8 is shown in which discrete conductive elements are utilized, such as one or more conductive elements 46, 48a-48c, of different configurations disposed thereon. Conductive element 46 is illustrated as a conductive layer or coating adjacent a row of openings 20. Conductive elements 48a-48c an alternate embodiment, are illustrated as electrically interconnected individual segments of a conductive layer or coating. A plurality of discrete first electrical conductors could be used disposed on mounting panel 8, with that plurality of first electrical conductors electrically interconnected together. Conductive elements 46, 48a-48c, may be made of any suitable material, such as conductive ink or a strip of conductive material.

Figure 10:
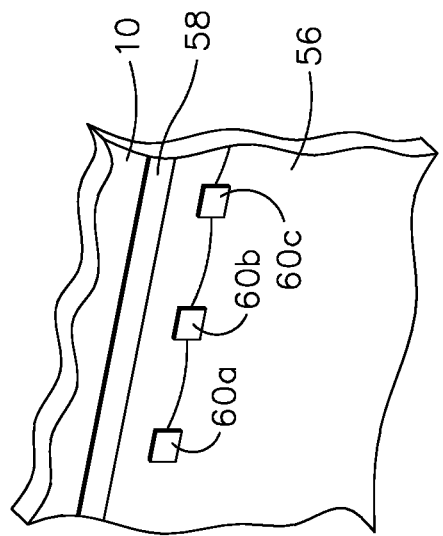
FIG. 10 is a fragmentary perspective view of and embodiment the second conductor of the mounting panel of the information display base.

Referring to FIGS. 2, 3 and 10, information display carrier 24 in the embodiment depicted comprises mount 30 with its tabs 32 and 34. When mount 30 comprises more than one mount, or comprises more than one tab, it is sufficient if only one tab comprises first electrical terminal 50. Information display carrier also comprises second electrical conductor 51 which comprises second electrical terminal 52. Electrical energy may be delivered via first electrical conductor 49 through first electrical terminal 50 and via second electrical conductor 51 through second electrical terminal 52. First and second electrical conductors are configured to provide electrical energy to information display 26. in any suitable manner, such as through jack 24a, or by being wired directly to information display 26. When tabs 32 and 34 are engaged with mounting panel 8, information display carrier 24 is located on first side 14, as illustrated in FIG. 2, tabs 32 and 34 contact second surface 16. When mounting panel 8 is made entirely of conductive material, electrical contact between tabs 32 and/or 34 and second surface 16 places first electrical terminal 50 in electrical contact with first electrical conductor 40.

When mounting panel 8 is made entirely of conductive material, portions of it may be masked or coated with non-electrically conductive material. For example, front surface 12 may be coated, leaving the inner walls of openings 20 and second surface 16 exposed to make electrical contact with first electrical terminal 50. Alternately, front surface 12 could be exposed, and first electrical terminal 50 could be configured to be in electrical contact with front surface 12. When conductive elements, such as conductive elements 46 or 48a-48c, are used, tab 32 and/or tab 34 make contact with the aligned conductive element disposed on second surface 16.

In the figures, mount 30 is depicted as attached to/carried by information display carrier 24. Alternatively, the mount could be configured to engage mounting panel 8 and electrically contact first electrical conductor 40, and further configured to be releasably connected to information display carrier 24 and in electrical contact with first electrical circuit 49. In such an embodiment, a mount could be selectively engaged with mounting panel 8 and then be releasably selectively engaged with different information display devices utilizing a standardized interface complementary to a range of different information display devices.

Second panel 10 includes first surface 56 facing second surface 16. Second panel 10 may be made entirely of a conductive material, or may be made of a non-conductive material with one or more conductive elements disposed to be electrically contacted by second electrical terminal 54 (as described below). An entire surface of second panel 10, such as first surface 56, may be conductive such as by a conductive layer or coating applied to or integral with second panel 10. Referring to FIG. 10, first surface 56 of second panel 10 is shown with one or more conductive elements 58, 60a-60c, of different configurations disposed thereon. Conductive element 58 is illustrated as a conductive layer or coating aligning with respective a row of openings 20 of mounting panel 8. Conductive elements 60a-60c, an alternate embodiment, are illustrated as electrically interconnected individual segments of a conductive layer or coating, also aligned with a respective row of openings 20 in mounting panel 8. A plurality of discrete second electrical conductors could be used disposed on mounting panel 8, with that plurality of second electrical conductors electrically interconnected. Conductive elements 58, 60a-60c, may be made of any suitable material, such as conductive ink or a strip of conductive material.

Referring to FIGS. 2 and 8, electrical second electrical terminal 52 is configured to extend through opening 22a of mounting panel 8, as shown, to locate distal end 54 on second side 18, with retractable shield 68 disposed in its retracted position. When information display carrier 24 is mounted to and supported by mounting panel 8 as shown, distal end 54 is in electrical contact with second electrical conductor 42, whether second panel 10 is configured entirely of an electrically conductive material, or whether second electrical conductor 42 comprises a plurality of discrete second conductive member 58 or 60a-60c.

Referring to FIGS. 2, 8, 11, 12, 13 and 14, the depicted embodiment of second electrical terminal 52 with retractable shield 68 is illustrated. Second electrical terminal 52 may be of any configuration suitable to extend through an opening of mounting panel 8 when information display carrier 24 is mounted to mounting panel 8 such that second electrical terminal 52 is in electrical contact with second electrical conductor 42 as described below. Retractable shield 68 may be omitted. In the depicted embodiment, body 24c includes housing 36 comprised of upper housing 36a and lower housing 36b. All components of body 24c may be made of any suitable material. Housing 36 may be secured to frame 24d in any suitable manner, such as by fasteners 82.

Housing 36 carries and retains retractable shield 68, which is depicted as generally cylindrical having an interior cavity. Housing 36 includes cylindrical guide 64, with upper guide portion 64a defined by upper housing 36a and lower guide portion 64b defined by lower housing 36b. Channel 66, defined by cylindrical guide 64, intersects with channel 70. Second electrical terminal 52 is partially disposed in channel 66, being retained therein when upper housing 36a and housing 36b are assembled together. Second electrical conductor 51 is electrically connected to second electrical terminal 52 by any suitable means or configuration. In the embodiment depicted, end portion 51a of second electrical conductor 51 may be disposed in channel 66 and channel 70 and connected directly to second electrical terminal 52. Alternatively, channel 66 and channel 70 may be lined with an electrically conductive material, such that partially disposing second electrical terminal 52 in channel 66 and partially disposing second electrical conductor 51 in channel 70, second electrical terminal 52 may be placed in electrical contact with second electrical conductor 51.

Retractable shield 68 includes annular cavity 72 defined by boss 74 in the interior cavity of retractable shield 68. One end of spring 76 is disposed in annular cavity 72 about boss 74. The other end of spring 76 rests against end 64a of cylindrical guide 64, such that, as assembled, spring 76 resiliently urges and biases retractable shield 68 toward its extended position. Second electrical terminal 52 may be sized and disposed such that distal end 54 is disposed completely within bore 68b when retractable shield 68 is fully extended.

Figure 13:
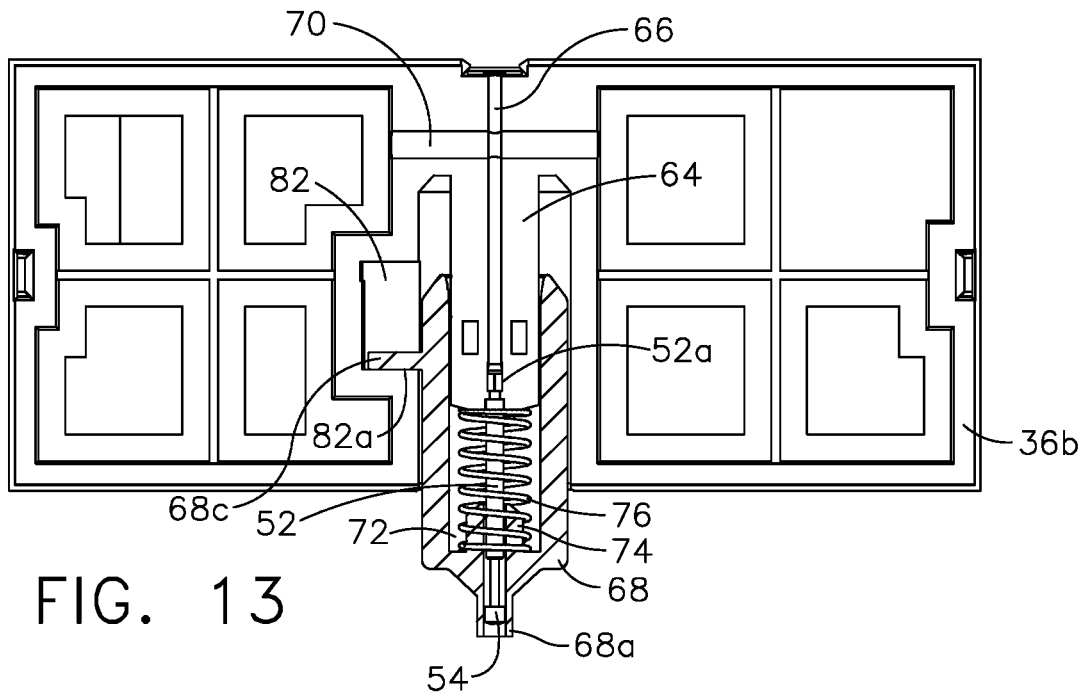
FIGS. 13 and 14 are a top plan view of the lower housing and cross section of the retractable shield illustrating the extended and retracted positions of the retractable shield.
Figure 14:
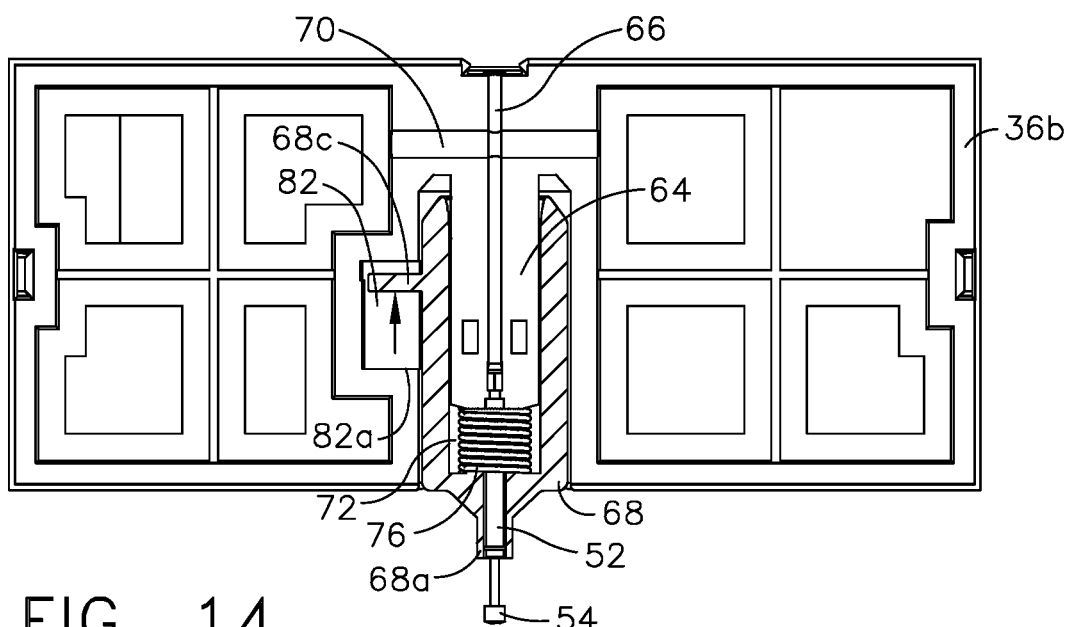
Figure 15:
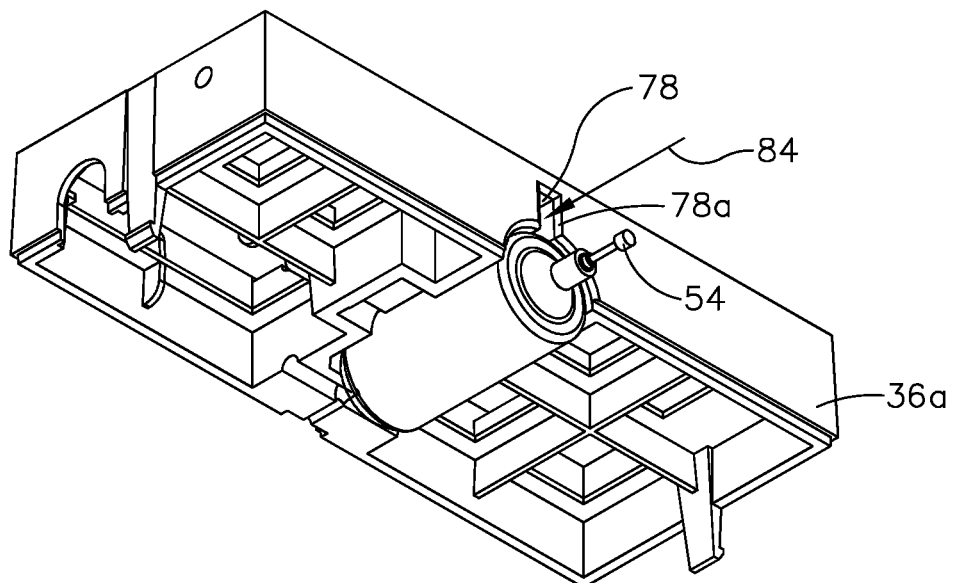
FIGS. 15 and 16 are bottom perspective views of the upper housing and retractable shield illustrating the insertion of the retractable shield into the housing and its retention by the housing.
Figure 16:
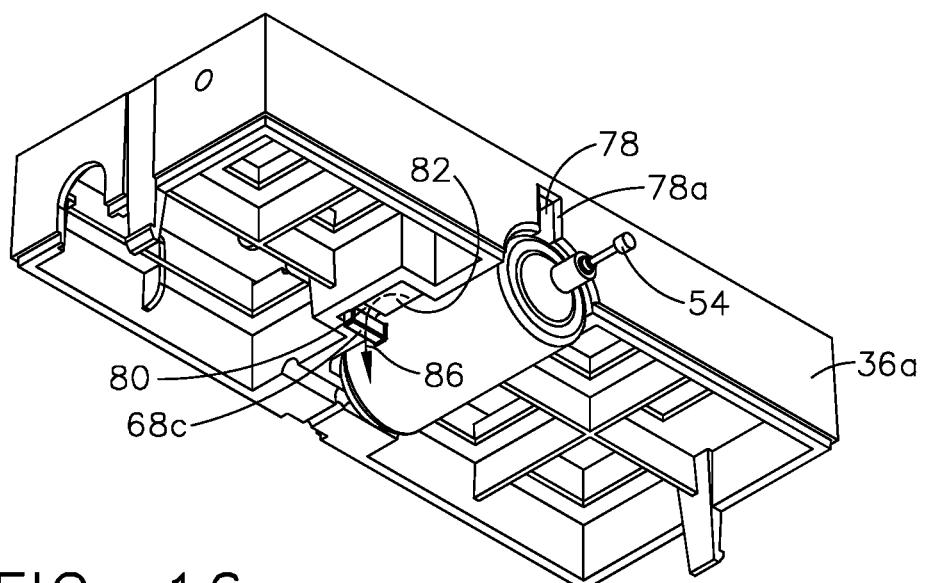

Retractable shield 68 includes tab 68c so that retractable shield 68 is retained by housing 36, moveable between its fully extended position as illustrated in FIG. 13 and its completely retracted position as illustrated in FIG. 14. Referring also to FIGS. 15 & 16, upper housing 36a includes slot 78 and tab 68c may be inserted into opening 78a. At the end of slot 78 opposite opening 78a, slot 78 is in communication with annular slot 80. Housing 36 also defines internal slot 82 which captures retention tab 68c. To assembly retractable shield 68 to housing 36, retention tab 68c is aligned with opening 78a and inserted therethrough into slot 78 as indicated by arrow 84. When retention tab 68c reaches annular slot 80, retractable shield 68 is rotated in the direction of arrow 86 until tab 68c reaches internal slot 82, as illustrated in FIG. 16. When retractable shield 68 is released, spring 76 urges retractable shield 68 to its extended position as illustrated in FIG. 13 at which retention tab 68c is stopped by and rests against wall 82a of internal slot 82.

When information display carrier 24 is not mounted to a mounting panel, retractable shield 68 is disposed to protect second electrical terminal 52, such as from incidental or unintended electrical contact, and to protect it from being broken off.

When information display carrier 24 is mounted to panel 8 as illustrated in FIG. 2, placing distal end 54 of second electrical conductor 52 in electrical contact with second electrical conductor 42, retractable shield 68 is in its retracted position as shown in FIGS. 2 and 14 with retention tab 68c not necessarily aligned with annular slot 80 thereby prevention rotation of retractable shield 68. Further depressing retractable shield 68 will align retention tab 68c with annular slot 80, permitting rotation and subsequent withdrawal of retractable shield 68 from housing 36.

Figure 17:
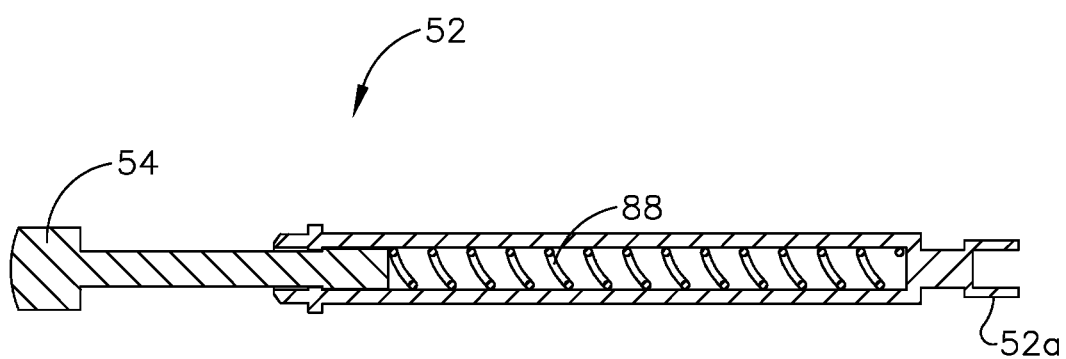
FIG. 17 is an enlarged cross-sectional view of the second terminal in an extended position.
Figure 18:
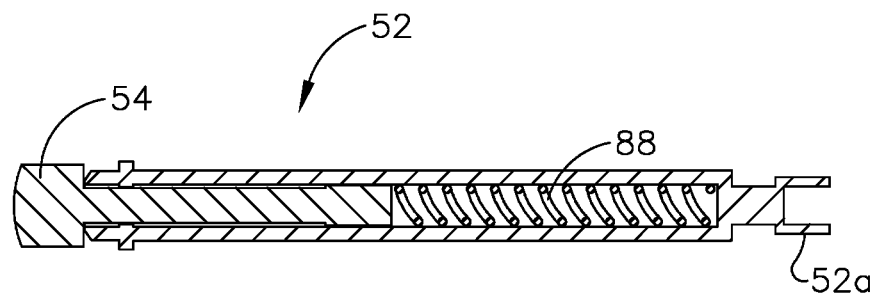
FIG. 18 is an enlarged cross-sectional view of the second terminal in a retracted position.

Distal end 54 may be axially resilient, biased outwardly, which may be in a direction which has a component of resiliency normal to first surface 56. As seen in FIGS. 17 and 18, distal end 54 of second electrical terminal 52 may be axially resiliently by use of spring 88, or any suitably resilient element. Second electrical terminal 52 may be configured at end 52a to be crimped to end portion 51a of second electrical conductor 51.

Figure 19:
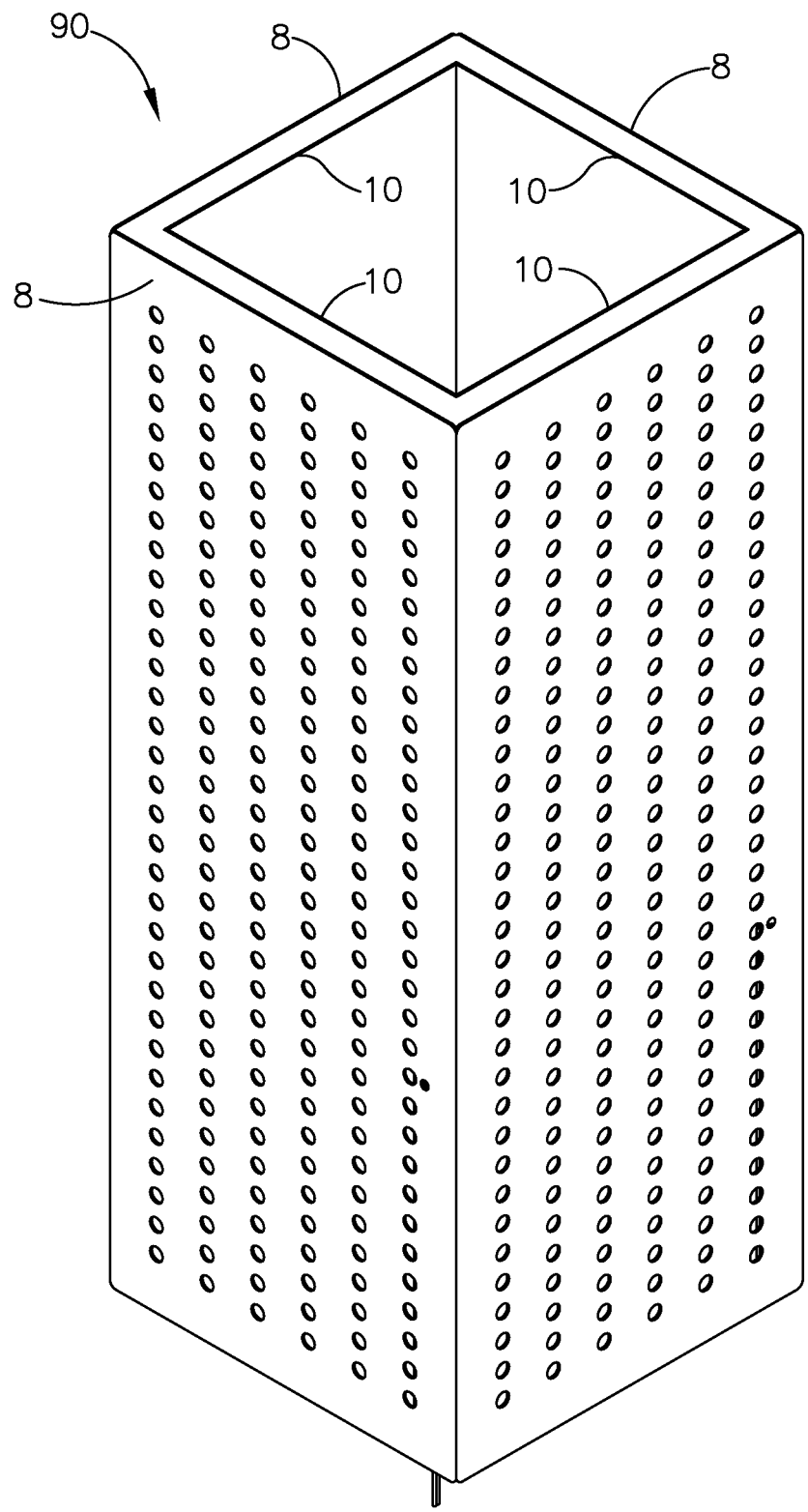
FIG. 19 is a perspective view of an alternate embodiment of an information display base.

Information display base 6 may be configured as modular components, which may be assembled together by fasteners, or interconnecting "snap-lock" type connectors. Suitable electrical connectors to connect first electrical conductors together and to connect second electrical conductor together. A plurality of mounting panels 8 may be interconnected into various configurations. FIG. 19 illustrates such an alternate embodiment, as information display base 90.

The foregoing description of an embodiment has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. Although only a limited number of embodiments of the invention are explained in detail, it is to be understood that the invention is not limited in its scope to the details of construction and arrangement of components set forth in the preceding description or illustrated in the drawings. The invention is capable of other embodiments and of being practiced or carried out in various ways. Also, specific terminology had been used for the sake of clarity. To the extent that the term "includes" is used in either the detailed description or the claims, such term is intended to be inclusive in a manner similar to the term "comprising" as "comprising" is interpreted when employed as a transitional word in a claim. It is to be understood that each specific term includes all technical equivalents which operate in a similar manner to accomplish a similar purpose. It is intended that the scope of this provisional filing will be better defined by the claims submitted with a later non-provisional filing. It is intended that the scope of the invention be defined by the claims submitted herewith.

What is claimed is:

1. An information display carrier adapted to be attached to a mounting panel, the mounting panel comprising first and second oppositely facing surfaces, the first surface defining a first side and the second surface defining a second side, the mounting panel comprising a plurality of spaced apart openings extending through the mounting panel from the first surface to the second surface, the information display carrier comprising:

a. a mount configured to attach the information display carrier to the mounting panel such that the information display carrier is disposed on the first side;
   b. a first electrical conductor comprising a first electrical terminal configured to be in electrical contact with at least one of the first surface and the second surface of the mounting panel when the information display carrier is attached to the mounting panel, the mount comprising the first electrical terminal; and
   c. a second electrical conductor comprising a second electrical terminal configured to be in electrical contact with an external electrical energy source, the second electrical terminal comprising a distal end, the second electrical terminal configured to extend through at least one of the plurality of openings to locate the distal end on the second side spaced apart from the mounting panel.

2. The information display carrier of claim 1, wherein the mount is selectively engageable with the mounting panel.

3. The information display carrier of claim 1, wherein the mount comprises at least one protruding tab.

4. The information display carrier of claim 3, wherein the at least one protruding tab comprises a plurality of spaced apart protruding tabs adapted to engage the mounting panel.

5. The information display carrier of claim 1, wherein the information display carrier comprises a magnet disposed to magnetically attract the information display carrier toward the mounting panel when the information display carrier is attached to the mounting panel.

6. The information display carrier of claim 1, wherein the distal end is axially resilient.

7. The information display carrier of claim 1, wherein the first electrical terminal is configured to be in electrical contact with the second surface when the information display carrier is attached to the mounting panel.

8. An information display base configured to have an information display carrier attached thereto, the information display base comprising:

a. at least one mounting panel comprising
  i. a first surface defining a first side;
  ii. a second surface defining a second side;
  iii. a plurality of spaced apart openings extending through the mounting panel from the first surface to the second surface; and
  iv. at least one of the first surface and the second surface comprising a first electrical conductor, the mounting panel adapted to support the information display carrier on the first side;
b. at least one second electrical conductor disposed on the second side and spaced apart from the second surface wherein the at least one first electrical conductor and the at least one second electrical conductor are adapted to be in electrical contact with an external electrical energy source.

9. The information display base of claim 8, wherein the second surface comprises the first electrical conductor.

10. The information display base of claim 8, wherein the plurality of spaced apart openings is arranged in a pattern.

11. The information display base of claim 10, wherein the pattern is uniform.

12. The information display base of claim 8, comprising a second panel disposed on the second side, wherein the second panel comprises the at least one second electrical conductor comprises a second panel disposed on the second side.

13. The information display base of claim 12, wherein the mounting panel and the second panel are generally planar and parallel to each other.

14. The information display base of claim 8, wherein the entirety of the mounting panel is electrically conductive.

15. The information display base of claim 8, wherein the first surface is coated with a coating that is not electrically conductive.

16. The information display base of claim 8, wherein the second surface comprises said first electrical conductor at least one conductive element.

17. The information display base of claim 16, wherein said first electrical conductor comprises at least one conductive element disposed on said second surface.

\* \* \* \* \*